United States Patent
Eschauzier

[19]

[11] Patent Number: 5,999,053
[45] Date of Patent: Dec. 7, 1999

[54] CURRENT STEERING VARIABLE GAIN AMPLIFIER WITH LINEARIZER

[75] Inventor: Rudolphe Gustave Eschauzier, Santa Clara, Calif.

[73] Assignee: Philips Electronics North America Corporation, New York, N.Y.

[21] Appl. No.: 09/108,329

[22] Filed: Jul. 2, 1998

[51] Int. Cl.$^6$ .............................. H03F 3/45; G06F 7/556
[52] U.S. Cl. ........................................... 330/254; 327/346
[58] Field of Search ................................... 330/252, 254; 327/359, 346

[56] References Cited

U.S. PATENT DOCUMENTS

| | | | |
|---|---|---|---|
| 4,017,804 | 4/1977 | Hunsinger | 330/29 |
| 5,570,056 | 10/1996 | Groe | 327/359 |
| 5,602,504 | 2/1997 | Liu | 327/359 |

Primary Examiner—Robert Pascal
Assistant Examiner—Patricia T. Nguyen
Attorney, Agent, or Firm—Brian J. Wieghaus

[57] ABSTRACT

A current steering circuit includes a first current steering pair of differentially coupled transconductance devices for current steering an input current signal to an output of the current steering circuit. A linearizer circuit includes a second pair of differentially coupled devices coupled electrically in parallel with the first current steering pair so that any current steering which takes place in the second pair is mirrored by the first pair. The linearizer circuit controls the second differential pair so that the current through the devices of the second differential pair that are coupled to the output device of the first current steering pair is exponentially dependent on the differential input voltage.

14 Claims, 4 Drawing Sheets

CURRENT STEERING VARIABLE GAIN AMPLIFIER WITH LINEARIZER

BACKGROUND OF THE INVENTION

1. Field of the Invention

The invention relates generally to current steering circuits for variable gain amplifiers ("VGA's"). More particularly, the invention provides a circuit which improves the linearity (in the dB scale) of the output of a current steering circuit.

2. Description of the Prior Art

VGA's are used in numerous electronic products such as global positioning (GPS) receivers, wireless local area networks and mobile communication devices, such as cordless and cellular phones. In particular, VGA's are used in various parts of such devices, for example, in the radio frequency (RF), intermediate frequency (IF) and the low frequency, or baseband circuits, of these devices.

FIG. 1 illustrates a prior art variable gain amplifier current steering circuit 100 having a differential pair (bipolar transistors Q1, Q2) which steers a portion of an input current signal "$I_{signal}$" received at input 102 to the output terminal 104, while the other, unused, portion of the input current signal is directed to ground. The amount of signal current that gets steered to the output depends on the differential control voltage "$V_{agc}$" applied to the bases of the transistors Q1, Q2 via the inputs 101, 102. The portion of the input signal current that flows through the transistor Q2 appears at the output terminal, while the remainder flows through the transistor Q1 to ground. In general, applying a higher control voltage to the base of the transistor Q2, as compared to the base of the transistor Q1, will allow a larger portion of the input signal current to be available at the output 104.

The formula for the gain control characteristic of the circuit 100 results from the translinear equations of the circuit loop closed by the base-emitter junction of the transistor Q1, the base-emitter junction of the transistor Q2 and the control voltage $V_{agc}$ present between the input terminals 101 and 102. The resulting expression is $$\frac{I_{c2}}{I_{c1}} = e^{\frac{V_{agc}}{V_T}} \quad (1)$$

where $I_{c1}$ and $I_{c2}$ are the collector currents of transistors Q1 and Q2, respectively, and $V_T$ is the thermal voltage, 26 mV at room temperature. Since $I_{c1}+I_{c2}=I_{signal}$ (disregarding the base currents), the gain control expression which follows from Eq. 1 is $$\frac{I_{out}}{I_{signal}} = \frac{I_{c2}}{I_{signal}} = \frac{1}{1+e^{V_{agc}/V_T}} \quad (2)$$

For gain control voltages $V_{agc}$ that are much smaller than 0, Eq. 3 shows a nice control characteristic in which the gain of the current steering circuit 100 is exponentially dependent on the control voltage.

$$\text{gain} = \frac{I_{out}}{I_{signal}} \approx e^{\frac{V_{agc}}{V_T}}, \quad V_{agc} \ll 0 \quad (3)$$

This exponential relationship is commonly referred to as linear-in-dB, since plotted on a dB scale Eq. 3 yields a straight line in a region where $V_{agc} \ll 0$. Unfortunately, going to higher voltages for $V_{agc}$, the linear-in-dB relationship of Eq. 2 does not hold anymore. At control voltages of about 0 volts and higher, the gain control curve starts flattening out and approaches unity gain.

The current steering circuit of FIG. 1 and the above analysis (equations 1–3) are known from the text: B. Gilbert, Current-Mode Circuits from a Translinear Viewpoint: a Tutorial, at Chapter 2 (United Kingdom 1990).

The non-linearity of the control characteristic (on a dB-scale) as the control voltage approaches and exceeds zero volts is an important drawback of the circuit for use in variable gain amplifier (VGA) applications, because it decreases sensitivity of the signal gain to control voltage variations at high gain settings.

Accordingly, it is an object of the invention to improve the linearity (in the dB scale) of the output of a variable gain amplifier.

SUMMARY OF THE INVENTION

Generally speaking, according to the invention, a current steering circuit includes a first differentially coupled current-steering pair of transconductance devices each having a control electrode and first and second conducting electrodes between which extends a main current path, the current through the main current path having an exponential relationship to a control voltage applied at the control electrode. The second conducting electrodes are commonly coupled to receive an input current signal. The first conducting electrode of the second transistor outputs an output current of the current steering pair. The current steering pair has a characteristic gain of the output current to the input current which is linear-in-dB over a first range of differential voltages applied at the control electrodes of the current steering pair. A linearizer circuit receives a differential gain control input voltage and applies control signals to the control electrodes of the devices of the first current steering pair such that the gain of the current steering pair is linear-in-dB over a range of differential control voltages which is greater than the first range of differential voltages.

In an embodiment, the linearizer circuit includes first and second control inputs each for receiving a respective control voltage defining a differential input voltage there across. A second differential pair includes third and a fourth differentially coupled transconductance devices electrically in parallel with the first differential pair so that any current steering which takes place across the second pair is mirrored by the first pair. The second control input is coupled to set the voltage at the control electrode of the second and third devices equal to a control voltage applied at the second control input. A feedback circuit maintains the voltage of the third device proportional to the differential input voltage, so that the current at its first conducting electrode, and consequently the current (and output current) at the first conducting electrode of the second transistor are exponentially dependent on the differential input voltage. In the disclosed embodiment, the circuit has a linear-in-dB gain characteristic up to a gain of 0 dB.

According to one embodiment, the transconductance devices are bipolar transistors having a base, and a collector and an emitter comprising the control electrode, and the first and second conducting electrodes. According to another embodiment, the transconductance devices are MOSFET's operating in their sub-threshold region and having a gate, a drain and a source comprising the control electrode and the first and second conducting electrodes.

The invention also concerns a method of controlling a current steering circuit to provide a linear-in-dB gain characteristic.

These and other object, features and advantages of the invention will become apparent with reference to the following detailed description and the drawings.

DESCRIPTION OF THE PREFERRED EMBODIMENTS

Figure 1:
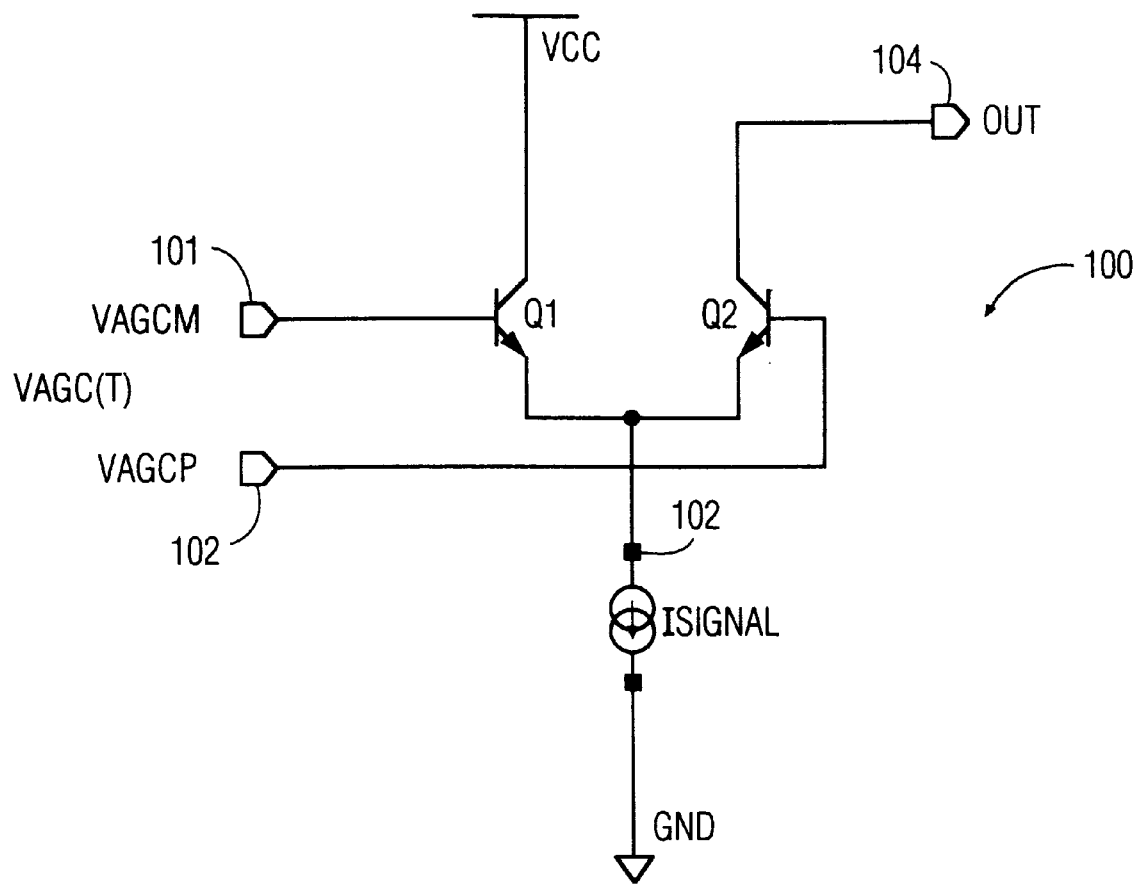
FIG. 1 is circuit diagram of a prior art current steering circuit for a variable gain amplifier.
Figure 2:
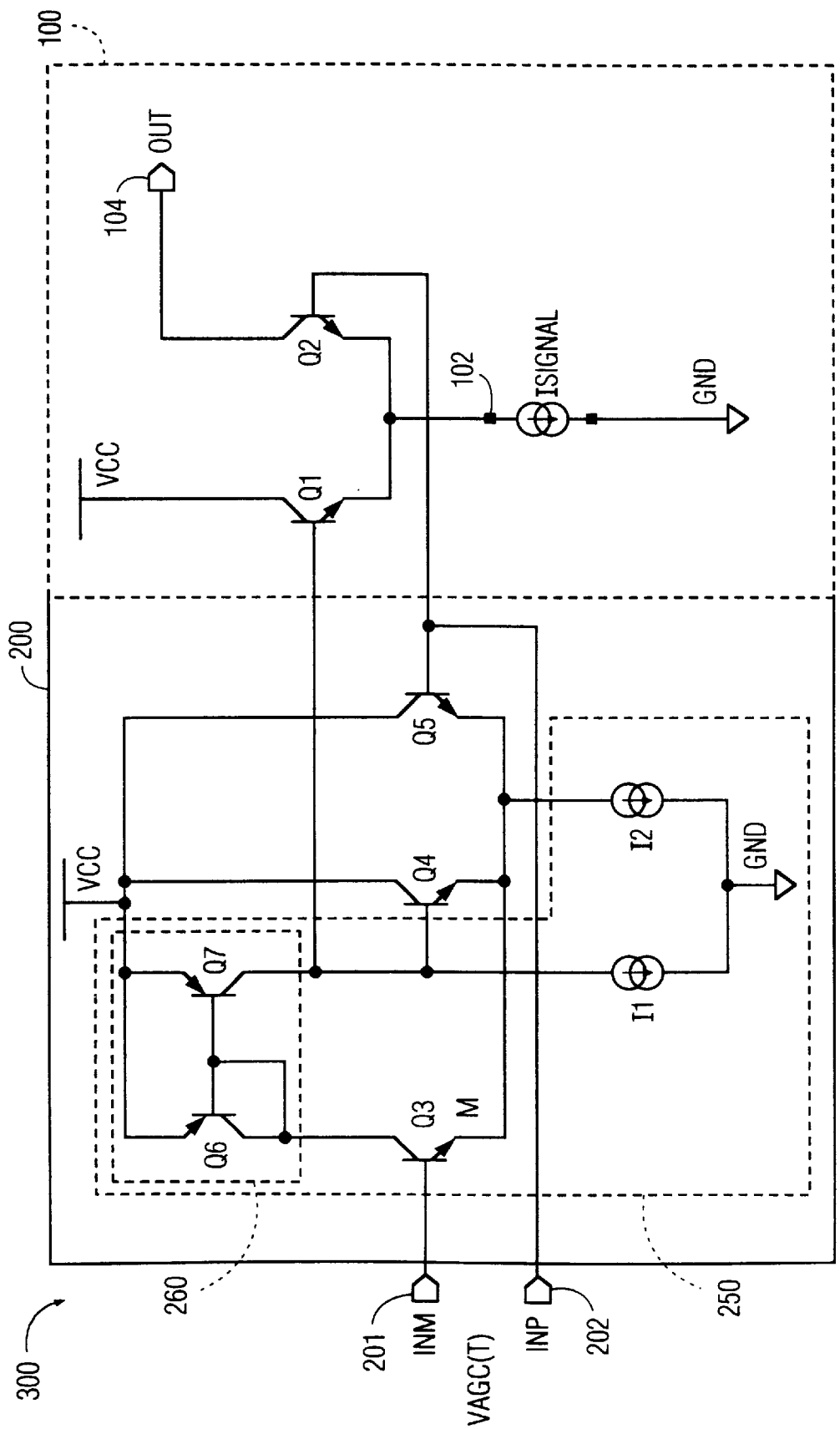
FIG. 2 is a circuit diagram of a variable gain amplifier with a current steering circuit according to the invention.

FIG. 2 illustrates an improved current steering circuit 300 according to the invention. Circuit elements the same as those in FIG. 1 bear the same reference legends. The circuit 300 includes a linearizer circuit 200 which linearizes the gain characteristic of the current steering differential pair (transistors Q1, Q2). In general, the linearizer circuit 200 receives a differential input voltage $V_{agc}$ at its gain control inputs 201, 202, and modifies it in such a way that feeding the resulting output voltage to the bases of the differential pair Q1, Q2 will result in a linear-in-dB gain control curve over a much greater range than the prior art circuit of FIG. 1.

The linearizer circuit 200 includes a second differentially coupled pair of bipolar transistors Q4 and Q5 which are electrically in parallel with the first differential pair Q1, Q2 of the current steering circuit 100. Each of the third and fourth transistors Q5 and Q4 has a collector coupled to the first voltage supply Vcc and an emitter coupled to one end of a current source I2, the other end of which is coupled to the lower voltage supply terminal, ground. The bases of the second and third transistors Q2 and Q5 are coupled to each other and to the input 202. The linearizer circuit also includes a feedback loop 250 formed by a bipolar transistor Q3 and a current mirror 260 which includes bipolar transistors Q6 and Q7. The transistors Q6 and Q7 each have a emitter coupled to the supply Vcc. The collector of the transistor Q7 is coupled to the bases of the transistors Q1 and Q4 and to one side of the current source I1. The other end of current source I1 is coupled to ground. The transistor Q3 has its base connected to the input 201, a collector connected to the collector of the transistor Q6 and an emitter coupled to a junction common to the current source I2 and the emitters of the transistors Q4 and Q5.

Since the transistors of the second differential pair Q4, Q5 of the linearizer circuit are electrically in parallel with the first differential pair Q1, Q2 of the current steering circuit 100, any current steering that takes place through transistors Q4 and Q5 will also apply to the transistors Q1 and Q2. Thus, the linearizer circuit controls the current steering of the transistors Q1, Q2 by imposing a current steering on the transistors Q4, Q5 with the desired linear-in-dB relationship with the differential gain control voltage $V_{agc}$.

The base voltage of the transistor Q5 is set directly by the control voltage at the input terminal 202. The feedback loop 250 fixes the emitter voltage of the transistor Q5 at a level derived from the input voltage at input terminal 201. This makes the base-emitter voltage of the third transistor Q5 proportional to the differential control voltage $V_{agc}$. Because of the exponential response of the bipolar transistor Q5, the collector current of the transistor Q5 is exponentially dependent on the same differential control voltage $V_{agc}$. Since the first differential pair Q1, Q2 mirrors the behavior of the second differential pair Q4, Q5, the collector current of the transistor Q2 will have the same exponential relationship with the differential control voltage $V_{agc}$ as does the collector current of the transistor Q5.

The feedback loop 250 fixes the emitter voltage of the third transistor Q5 (and of the transistors Q3 and Q4) as follows. The current mirror 260 makes the collector current of the transistor Q3 equal to the current provided by the current source I1. The current source I2 biases the emitters of the transistors Q3, Q4 and Q5 with same current level as that provided to the collector of the transistor Q3. In FIG. 2, there are three devices Q3, Q4, Q5 biased by the source I2, so the total current provided by source I2 is three times that of the current provided by the source I1. Since the collector current of the transistor Q3 is fixed by the source I1, the base-emitter voltage of the transistor Q3 will be constant. Therefore, the common emitter nodes of the transistors Q3, Q4 and Q5 will follow the voltage at the input 201 with a constant base-emitter diode voltage drop.

The behavior of the linearizer circuit 200 is derived from the equations for the translinear loop closed by the base-emitter junction of the transistor Q3, the base-emitter junction of the transistor Q5 and the differential control voltage $V_{agc}$ between inputs 201 and 202. This results in $$\frac{mI_{c5}}{I_{c3}} = e^{\frac{V_{agc}}{V_T}} \quad (4)$$

where $I_{c5}$ and $I_{c3}$ represents the collector currents of the transistors Q5 and Q3, respectively. The variable m in equation 4 corresponds to the notation m at the emitter of transistor Q3 in FIG. 2. and represents the number of parallel devices for device Q3. For example, where m=1 there is only one transistor Q3 as in FIG. 2. When m=6, there would be six parallel transistor Q3 in FIG. 2, each having a base tied to the input 201, collectors coupled to the current mirror transistor Q6 and emitters commonly coupled to the emitters of the transistor Q4 and Q5. The variable m serves as a parameter to set the attenuation of the current steering circuit when the control voltage $V_{agc}$ is 0 volts.

Since the feedback loop 250 assures that there is a constant current I1 flowing through the transistor Q3, Eq. 4 can be rewritten as $$I_{c5} = \frac{I_1}{m} e^{\frac{V_{agc}}{V_T}} \quad (5)$$

The first differential pair Q1, Q2, as already mentioned, tracks the current steering between transistors Q4 and Q5. This allows Eq. 5 to be rewritten as $$\frac{I_{out}}{I_{signal}} = \frac{1}{m} e^{\frac{V_{agc}}{V_T}} \quad (6)$$

Equation 6 establishes the desired linear-in-dB control relation between the input current "$I_{signal}$" and the output current "$I_{out}$".

Figure 3:
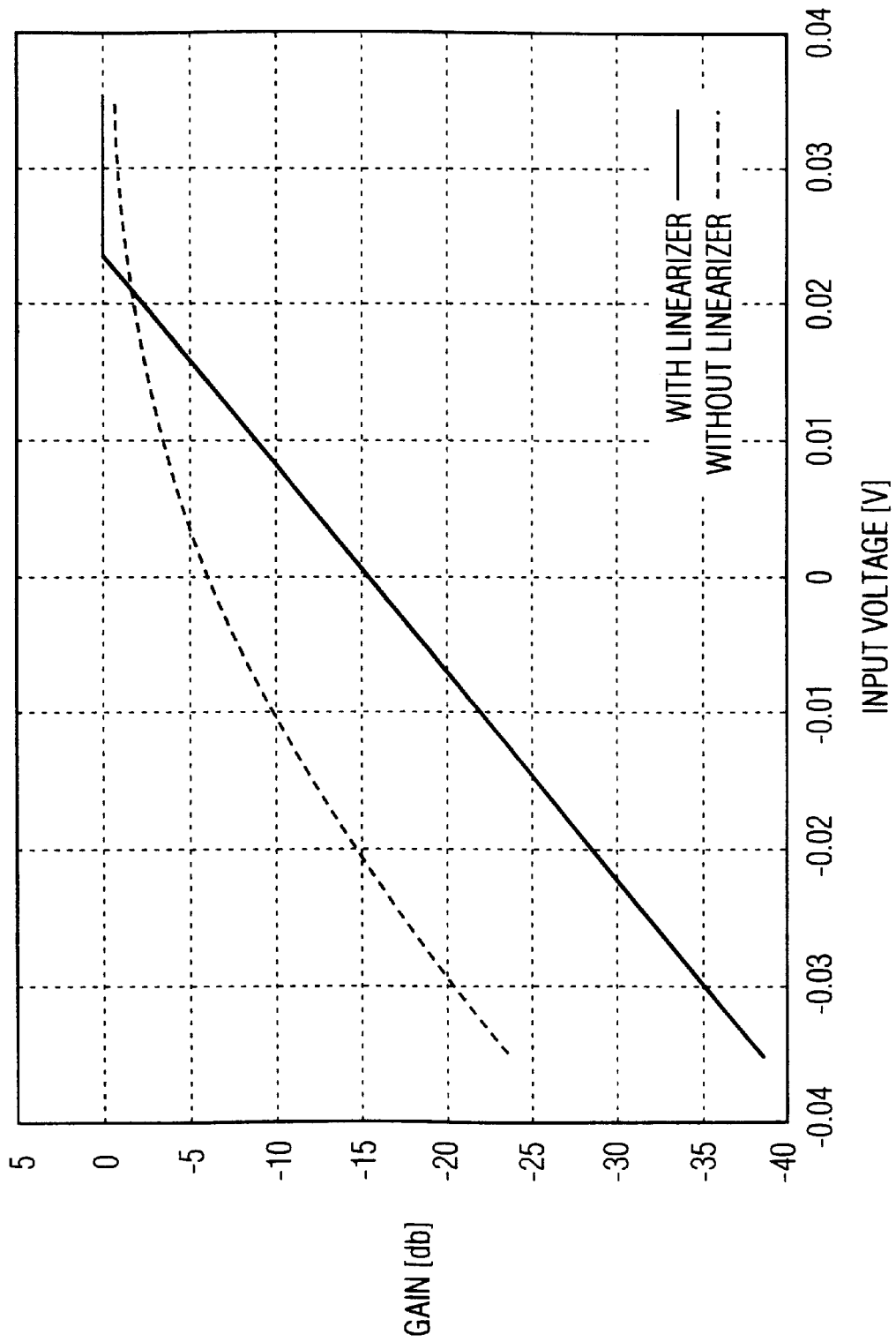
FIG. 3 illustrates the linear-in-dB output of the circuit according to FIG. 3.

The resulting curve for m=6 is shown as the solid line in FIG. 3, which is a graph of the gain (in dB) of the output signal $I_{out}$ relative to the input signal $I_{signal}$ verses the differential input voltage Vagc (T)(in Volts). The dashed line represents the behavior of the prior art circuit of FIG. 1, and is linear only up to a gain of about 15 dB. At higher gains and input voltages, the gain curve asymptotically approaches a gain level of 0 dB. The solid line represents the behavior of the circuit of FIG. 2. Note that the gain characteristic is a straight line right up to a gain of 0 dB, corresponding to a voltage of about +2.3 mV. This is the limiting case of Eq. 6, since at that point all the signal current $I_{signal}$ at the input of the differential pair Q1, Q2 gets directed to the output terminal 104.

Figure 4:
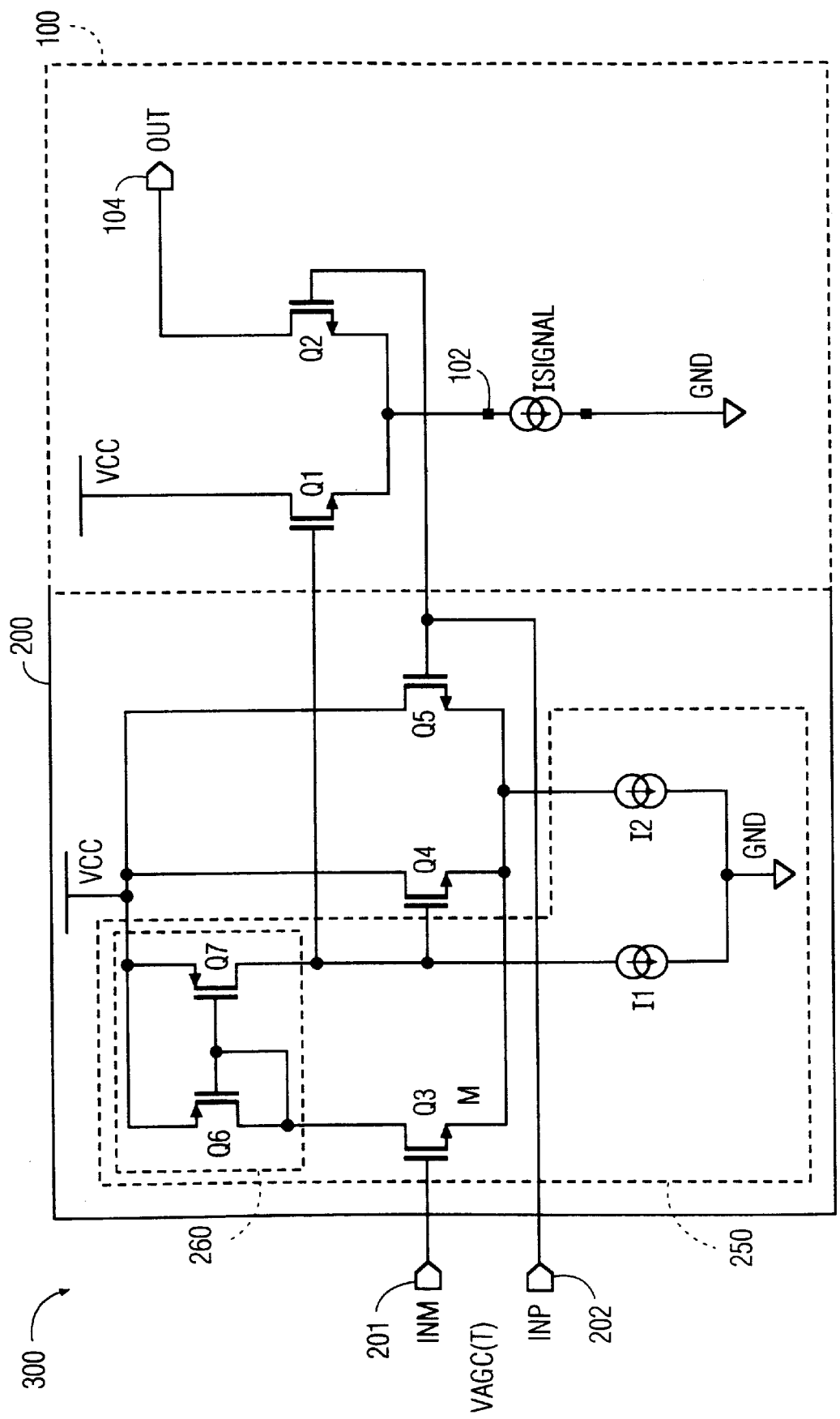
FIG. 4 is a circuit diagram corresponding to FIG. 2 in which MOSFET's are substituted for the bipolar transistors of FIG. 2.

It is noted that in FIG. 1 and FIG. 2, bipolar transistors were shown and described as these are the devices predominantly used in VGA circuits. The invention is not so limited, however, and other transconductance devices may be used which exhibit an exponential relationship between the device current and a control signal applied at a control electrode thereof. For example, in certain applications, MOSFET's may be substituted for the bipolar transistors, as MOSFET's exhibit the desired exponential characteristic when operating in their sub-threshold region. FIG. 4 illustrates a circuit corresponding to that of FIG. 2 in which corresponding elements bear the same reference numerals. PMOS devices have been substituted for the PNP devices (Q1–Q5) and NMOS devices have been substituted for the NPN devices (Q6, Q7) of FIG. 2. Thus, generally speaking, the bipolar transistors and MOSFETs each embody a transconductance device where the base, collector and emitter of the bipolar transistor and, similarly, the gate, drain and source of the MOSFETs correspond, respectively, to the control electrode, and first and second conducting electrodes of a "transconductance device" as used herein. Additionally, it is noted that current mirror transistors Q6, Q7 may be MOSFET's when the devices Q1–Q5 are bipolar, and vice versa.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A current steering circuit, comprising:
   a current steering pair of transconductance devices including first and second differentially coupled transconductance devices each having a first and second conducting electrodes between which extends a main current path, and a control electrode which controls the current through said main current path, the current through said main current path having an exponential relationship to a control voltage applied at said control electrode, said second conducting electrodes being commonly coupled for receiving an input current signal, and said first conducting electrode of said second device outputting an output current of the current steering circuit, said current steering pair having a characteristic gain of the output current to the input current which is linear-in-dB over a first range of differential voltages applied at said control electrodes of said first and second transconductance devices; and
   a linearizer circuit which receives a differential control voltage and applies control voltages to said control electrodes of said first and second devices such that the gain of the current steering circuit is linear-in-dB over a range of said differential control voltages which is greater than said first range.

2. A current steering circuit according to claim 1, wherein said linearizer circuit comprises a third transconductance device coupled electrically in parallel with said first and second devices, said third device having (i) a control electrode coupled to said control electrode of said second device and (ii) a voltage between the third device control electrode and the third device second conducting electrode proportional to said differential input voltage.

3. A current steering circuit according to claim 2, wherein said linearizer circuit includes first and second control inputs which receive said differential control voltage there across, a second pair of said differentially coupled transconductance devices including said third transconductance device and a fourth transconductance device, said control electrode of said third device being coupled to second input, and
   a feedback circuit including a fifth transconductance device electrically in parallel with said third and fourth transconductance devices, said fifth transconductance device having a control electrode coupled to said first input and a second conducting electrode commonly coupled to the second conducting electrodes of said second pair of differentially coupled devices, a first current source biasing said commonly coupled second electrodes of said third, fourth and fifth devices, and a second current source coupled to bias the first conducting electrode of said fifth device with a same current as the bias current of said third, fourth and fifth devices.

4. A current steering circuit according to claim 3, wherein said feedback circuit further comprises a current mirror coupling said second current source to said first conducting electrode of said fifth device.

5. A current steering circuit according to claim 3, wherein each of said first through fifth transconductance devices are bipolar transistors having a base comprising said control electrode, and a collector and an emitter comprising said first and second conducting electrodes, respectively.

6. A current steering circuit according to claim 3, wherein each of said first through fifth transconductance devices are MOSFET's having a gate comprising said control electrode, and a drain and a source comprising said first and second conducting electrodes.

7. A current steering circuit according to claim 1, wherein each of said first and second transconductance devices are bipolar transistors having a base comprising said control electrode, and a collector and an emitter comprising said first and second conducting electrodes, respectively.

8. A current steering circuit according to claim 1, wherein each of said first and second transconductance devices are MOSFET's having a gate comprising said control electrode, and a drain and a source comprising said first and second conducting electrodes.

9. A current steering circuit according to claim 1, wherein said first range has an upper limit of about −0.02 V, and the upper limit of said range of said differential control voltages input to said linearizer circuit and providing said linear-in-dB gain characteristic is about +0.023 V.

10. A current steering circuit according to claim 1, wherein said gain with said linearizer circuit is linear-in-dB up to a gain of 0 dB.

11. A variable gain current steering amplifier, comprising:
    a first voltage supply terminal and a second voltage supply terminal having a lower potential than said first voltage supply terminal;

a current steering circuit including a current signal input for receiving an input current signal, a current signal output for outputting an output current, first and second bipolar transistors forming a first differential pair, each transistor having a base, and an emitter commonly coupled to said current signal input, said first transistor having a collector coupled to said first voltage supply terminal and said second transistor having a collector coupled to said output;

a linearizer circuit including (i) first and second control inputs each for receiving a respective control voltage defining a differential control voltage there across, (ii) a third and a fourth differentially coupled bipolar transistor forming a second differential pair, said third and fourth transistors each having a collector coupled to said first voltage supply terminal, said second control input being coupled to set the base voltage of said second and third transistors equal to a control voltage applied at said second control input, and (iii) a feedback circuit which maintains the base-emitter voltage of said third transistor proportional to the differential input voltage, said feedback circuit including a fifth bipolar transistor electrically in parallel with said third and fourth transistors, said fifth transistor having a base coupled to said first input and an emitter commonly coupled to the emitters of said second pair of differentially coupled transistors, a first current source biasing said commonly coupled emitters of said third, fourth and fifth transistors, and a second current source coupled to bias the collector of said fifth transistor with a same current as the emitter bias current of said third, fourth and fifth transistors, and a current mirror coupling said second current source to said collector of said fifth transistor.

12. A current steering circuit, comprising:

a current signal input for receiving an input current signal, a current signal output for outputting an output current, first and second bipolar transistors forming a first differential pair, each transistor having a base, and an emitter commonly coupled to said current signal input, said first transistor having a collector coupled to said first voltage supply terminal and said second transistor having a collector coupled to said output;

first and second control inputs each for receiving a respective control voltage defining a differential control voltage there across; and linearizing means for maintaining the output of said current steering circuit exponentially dependent on the differential control voltage, said linearizing means including a second pair of differentially coupled bipolar transistors including a third bipolar transistor and a fourth bipolar transistor, means for setting the base voltage of said second and third transistors to the voltage at said second input, and means for setting the emitter voltage of said third and fourth transistors to control the base-emitter voltage of said third transistor proportional to the differential control voltage.

13. A method of linearizing in dB scale the output of a current steering circuit having first and second differentially coupled transconductance devices each having a control electrode and first and second conducting electrodes, said first conducting electrode of said second transistor outputting an output current of the current steering circuit, said second conducting electrodes being commonly coupled for receiving an input current signal, said method comprising the steps of:

providing a second pair of said differentially coupled transconductance devices electrically in parallel with said first pair, said second pair including a third said device having a control electrode coupled to the control electrode of said first device and a fourth said device having a control electrode coupled to the control of said first device;

setting the voltage at said control electrode of said second and third devices to a first control voltage; and controlling the voltage between the control electrode and the second conducting electrode of said third device proportional to a differential control voltage.

14. A method according to claim 9, wherein said first through fourth devices are bipolar transistors, and said step of controlling controls the base-emitter voltage of said third bipolar transistor proportional to the differential control voltage.

* * * * *